United States Patent [19]

Yazdy

[11] Patent Number: 4,924,115
[45] Date of Patent: May 8, 1990

[54] INTEGRATED CIRCUIT RC FILTERS WITH VERY LARGE TIME CONSTANTS

[75] Inventor: Mostafa R. Yazdy, Los Angeles, Calif.

[73] Assignee: Xerox Corporation, Stamford, Conn.

[21] Appl. No.: 312,161

[22] Filed: Feb. 21, 1989

[51] Int. Cl.$^5$ .................. H03K 17/16; H03K 5/00
[52] U.S. Cl. ........................ 307/443; 328/167; 307/520
[58] Field of Search .............. 307/443, 520, 352; 328/167, 165, 127

[56] References Cited

U.S. PATENT DOCUMENTS

| | | | |
|---|---|---|---|
| 4,305,091 | 12/1981 | Cooper | 328/165 |
| 4,555,669 | 11/1985 | Namiki | 328/165 |
| 4,701,715 | 10/1987 | Amazawa et al. | 307/520 |
| 4,724,395 | 2/1988 | Freeman | 307/520 |

Primary Examiner—Stanley D. Miller
Assistant Examiner—Richard Roseen
Attorney, Agent, or Firm—Robert E. Cunha

[57] ABSTRACT

This circuit is an input noise filter. An RC circuit comprises a capacitor implemented from a transistor with source and drain tied together and a long transistor acting as a resistance which can either be large or small, depending on the bias. The output of the RC circuit is applied to a comparator where it is compared to a threshold voltage. When a signal is first applied to the input, the resistance is high, so that the RC circuit charges slowly. With the input signal still applied, after the comparator threshold is reached and the output from the comparator goes high, a feedback circuit senses the output and decreases the resistance, allowing the RC circuit to rapidly charge up. Finally, after the input signal ends, the feedback loop again raises the resistance to allow the RC voltage to discharge slowly to the threshold level, after which the comparator output goes low. The result is a circuit that does not shrink the digital input signal but still filters out input noise.

1 Claim, 5 Drawing Sheets

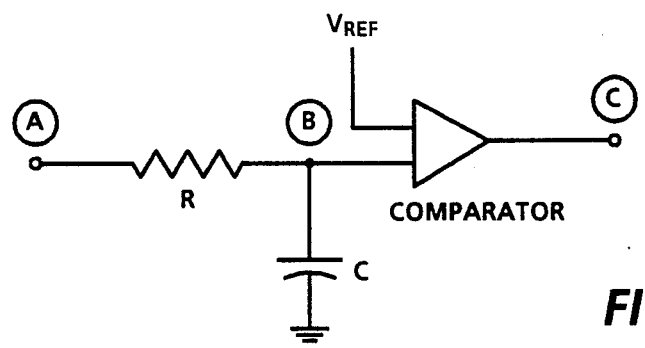
FIG. 2
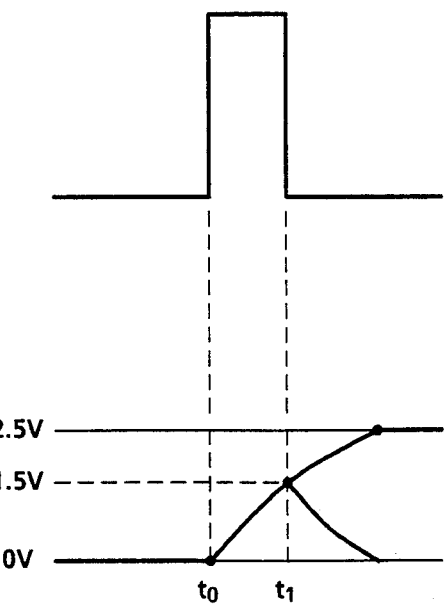
FIG. 3A
FIG. 3B

INTEGRATED CIRCUIT RC FILTERS WITH VERY LARGE TIME CONSTANTS

This invention relates to rejecting high frequency noise signals in input digital signals applied to very large scale integrated circuits. By the use of a single long transistor on the integrated circuit chip together with a transistor operated as a capacitor in conjunction with a comparator circuit and accompanying feedback and monitoring elements, a very large resistance for the RC time constant can be realized with a reasonable size for the transistor.

BACKGROUND OF THE INVENTION

State of the art integrated circuits should be capable of rejecting high frequency noise in the input digital signals. For this reason, the prior art has shown the use of large RC time constant filters in the input circuitry of the integrated circuits. The large RC time constant delays the applicaton of the applied input signal to subsequent circuitry until the noise signal fades away, thus insulating the subsequent circuitry from the deleterious effects of the noise signal. A longer, true digital data signal gets through, while the noise signal does not. To effect this on-chip filtration, on-chip RC (resistor/capacitor) filters require a very large time constant (40 microseconds or larger). Conventional techniques for realizing on-chip RC filters require very large capacitance and very long transistors which not only increase the silicon chip area, but more importantly make the circuit more vulnerable to failure due to large leakage currents associated with these long devices. The conventional methods also suffer from the problem of 'pulse shrinkage'.

To overcome these problems, the technique of the present invention as illustrated below can be used, which increases the effective resistance of on-chip transistors and the time constants of RC filters substantially without increasing the silicon area and also improves the pulse shrinkage problem. According to the present invention, by the use of a single long transistor on the integrated circuit chip, together with a transistor operated as a capacitor in conjunction with a comparator circuit and accompanying feedback and monitoring elements, a very large resistance in the RC time constant can be realized with a reasonable size for the transistor.

DESCRIPTION OF THE DRAWINGS

For a more complete understanding of the invention, reference may be had to the following detailed description of the invention in conjunction with the drawings wherein:

FIG. 2 is a schematic diagram of the representative circuit that is desired to be implemented on an integrated circuit chip;

FIGS. 3A and 3B are a noise signal and voltage vs. time curve, respectively, for a noise signal;

FIGS. 6A, 6B, 6C, and 6D are a data signal, voltage vs. time curve, output pulse, and output pulse as would be from the circuit in FIG. 1, respectively, for the circuit in FIG. 5.

DETAILED DESCRIPTION OF THE INVENTION

Figure 1:
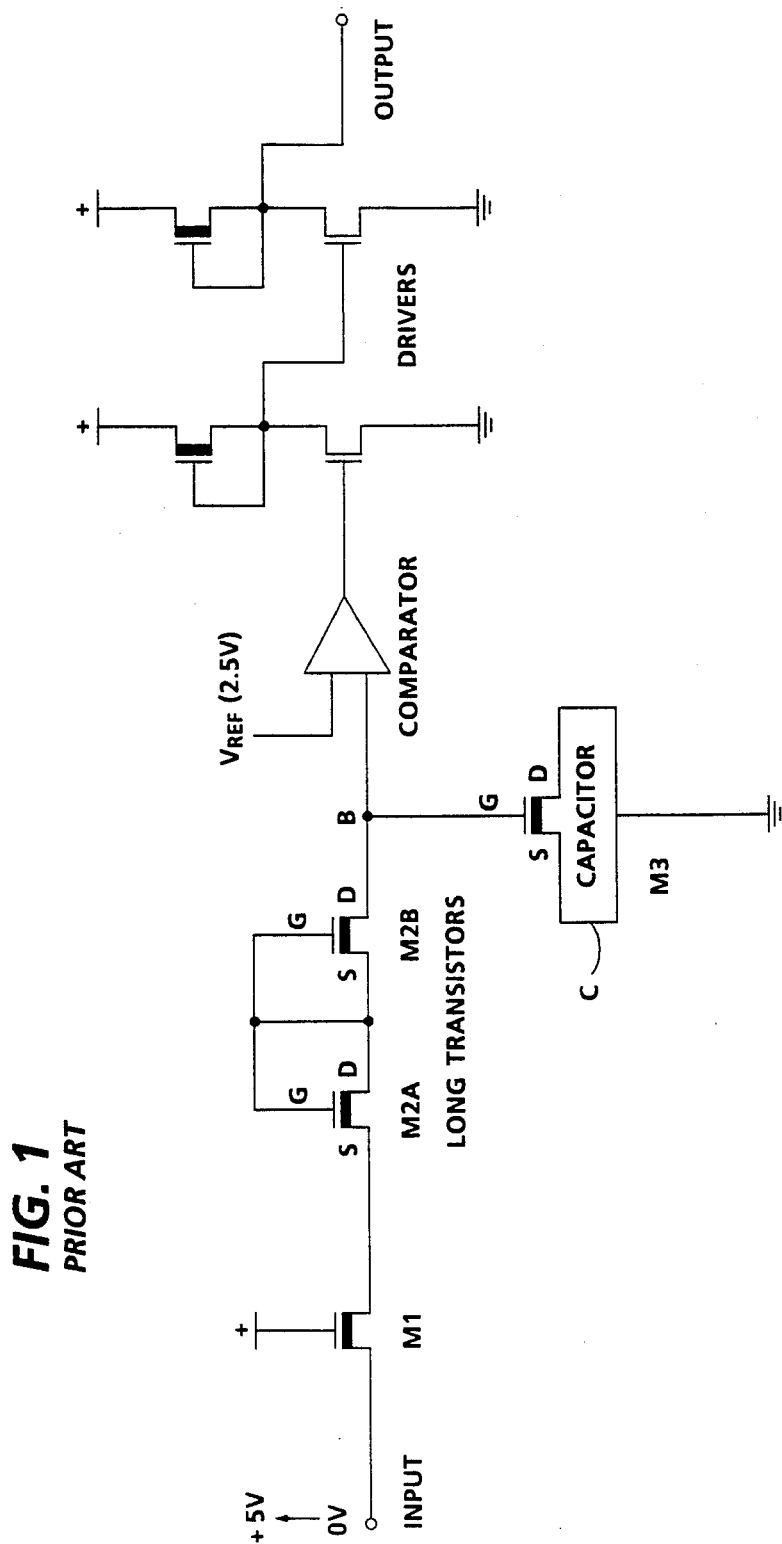
FIG. 1 is a schematic diagram of a prior art RC filter as implemented in nMOS technology.

FIG. 1 illustrates a conventional, prior art, RC filter as would be commonly used to reject high frequency noise signals from applied digital signals. Two depletion mode transistors M2A and M2B are used to form the large resistance, while the capacitance C is realized by the gate capacitance of a depletion mode transistor M3. Transistor M3 becomes a capacitor when its drain and source electrodes are connected together. In FIG. 1, these electrodes are connected to ground. Transistor M1 is utilized in FIG. 1 as a mere switch. That is, when a supply voltage is applied to it, the remainder of the circuit is operable. When the voltage is removed, however, the input signals, both real and noise signals, are prevented from passing through.

Before describing the actual operation of FIG. 1, it would be helpful in understanding the principles involved here in using a transistor as a high resistance element in a integrated circuit environment. In FIG. 2 is shown a simplified circuit that FIG. 1 (and the invention in FIG. 5) comprises. That is, FIG. 2 shows an input terminal A, resistor R, capacitor C, comparator CO, node B where the resistor and capacitor are connected in an RC circuit and applied to the comparator CO, and an output terminal C. The other input to the comparator would be the measuring voltage, for example 2.5 volts. If a noise pulse of, say, 5 volts with a time duration of 1 usec, is applied to the circuit at terminal A at time $t_0$, FIG. 3A, the capacitor C would begin charging to the 5 volt level of the input noise signal at the RC time constant charging rate. But 1 usec later, at time $t_1$. FIG. 3B, the noise pulse shuts off, but the voltage charge rate of capacitor C has only allowed it to reach, say, 1.5 volts before the noise pulse disappeared. Since the comparator circuit requires a voltage level of the example of 2.5 volts, there is no output signal from the comparator CO because the voltage charge rate of the RC time constant prevented the narrow noise pulse from charging too quickly and triggering the comparator circiut $C^0$. The larger the value of resistor R, the longer it takes capacitor C to charge up. Thus, the circuit designer cannot make the value of R much too high, or desired input data signals will similarly be filtered out.

Returning to FIG. 1, the prior art solution, it is seen that when the input voltage changes from low to high, say 0 to 5 v (for either a data or noise signal), transistor M2B is operated in the triode region and provides a very small resistance. Transistor M2A is initially in saturation and provides a very large resistance. As the voltage of node B in FIG. 1 gradually increases as the capacitor charges to the level of the input signal, transistor M2A gradually shifts from the saturation region to the triode region. The resistance of the transistors is given by the relationships:

(1) $Rds = 1/\{Kp(W/L)(Vgs+Vthd)\}$ triode region (2) $Rds = 1/\{k(Kp/2)(W/L)(Vgs+Vthd)\}^2$ saturation region where Rds is the drain to source resistance, Kp is a gain factor constant for both equations, k is the channel length modulation of transistors and typically is a very small number (typically 0.01), W is the width of the transistor on the integrated circuit chip, L is the length of the transistor, Vgs is the gate to source voltage, and Vthd is the threshold voltage of the depletion transistors. As all the values are in the denominator of the fraction, it behooves a designer to make some of the values as large as practical so the overall value or R will be bigger. In equation 1 for FIG. 1, Vthd is approximately 3.2 v and Vgs is always zero (the electrodes are tied together), and thus to make the value of R as large as necessary, the length L of the transistor must be very large. In the instance of FIG. 1, typical values would be width W of 4 microns and a length L of 4000 microns. But, the larger the transistor, the more area of silicon is used for the transistor, with a concomitant increase in leakage current leading to a less efficient transistor.

Figure 4A:
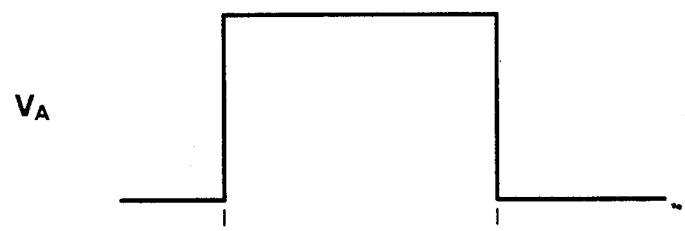
FIGS 4A, 4B, and 4C, are a data signal, voltage vs. time curve, and output shrunken pulse, respectively, for the circuit in FIG. 1.
Figure 4B:
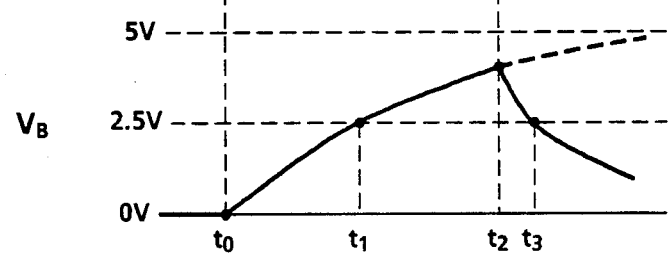
Figure 4C:
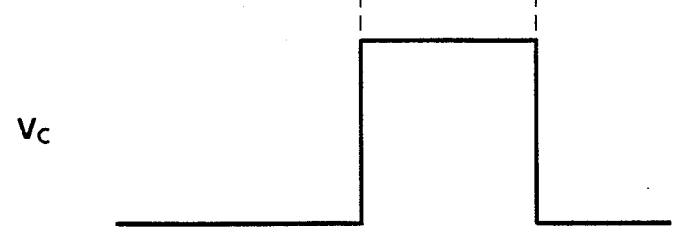

FIG. 4A shows a typical data pulse applied to the circuit of FIG. 1. At $t_0$, when the data pulse is applied, the capacitor begins charging toward the upper value of the data pulse, say, 5 v. As the voltage begins charging, the output remains the same because the reference voltage Vref of the comparator circuit has not yet been reached. If the Vref is at 2.5 v as shown in FIG. 1, there will be a change at the output of the comparator, at the time $t_1$ when the voltage at both inputs to the comparator are the same. At time $t_2$, in this example, the input data signal shuts off, or returns to zero, the charging of capacitor ceases and the capacitor begins to discharge at the same rate it did when charging. Thus, while the input signal has shut off, the output from the comparator remains high because the compared voltage is higher than the reference voltage Vref. Only when the discharging voltage again equals and then falls below Vref will the output of the comparator shut off, or go low again. Since the time to go from $t_0$ to $t_1$ is longer than from $t_2$ to $t_3$, the output pulse from the comparator and driving circuits is narrower than the input pulse. This is a distinct problem as the output pulse may never precisely equal the applied pulse.

For FIG. 1, the examples above have assumed that the noise pulse goes from low to high (0 to 5 v in the illustration). If the noise pulse is actually a high to low pulse, then the second transistor M2B is used to provide the large resistance and transistor M2A provides the low resistance path. That is, when the input voltage changes from high to low, M2A is always operating in the triode region and providing a very small resistance. The required large resistance is now provided by M2B which is originally in the triode operating region, but eventually moves to the saturation region. In the conventional circuit of FIG. 1, the source and gate electrodes are always tied together, i.e., Vgs=0.

Figure 5:
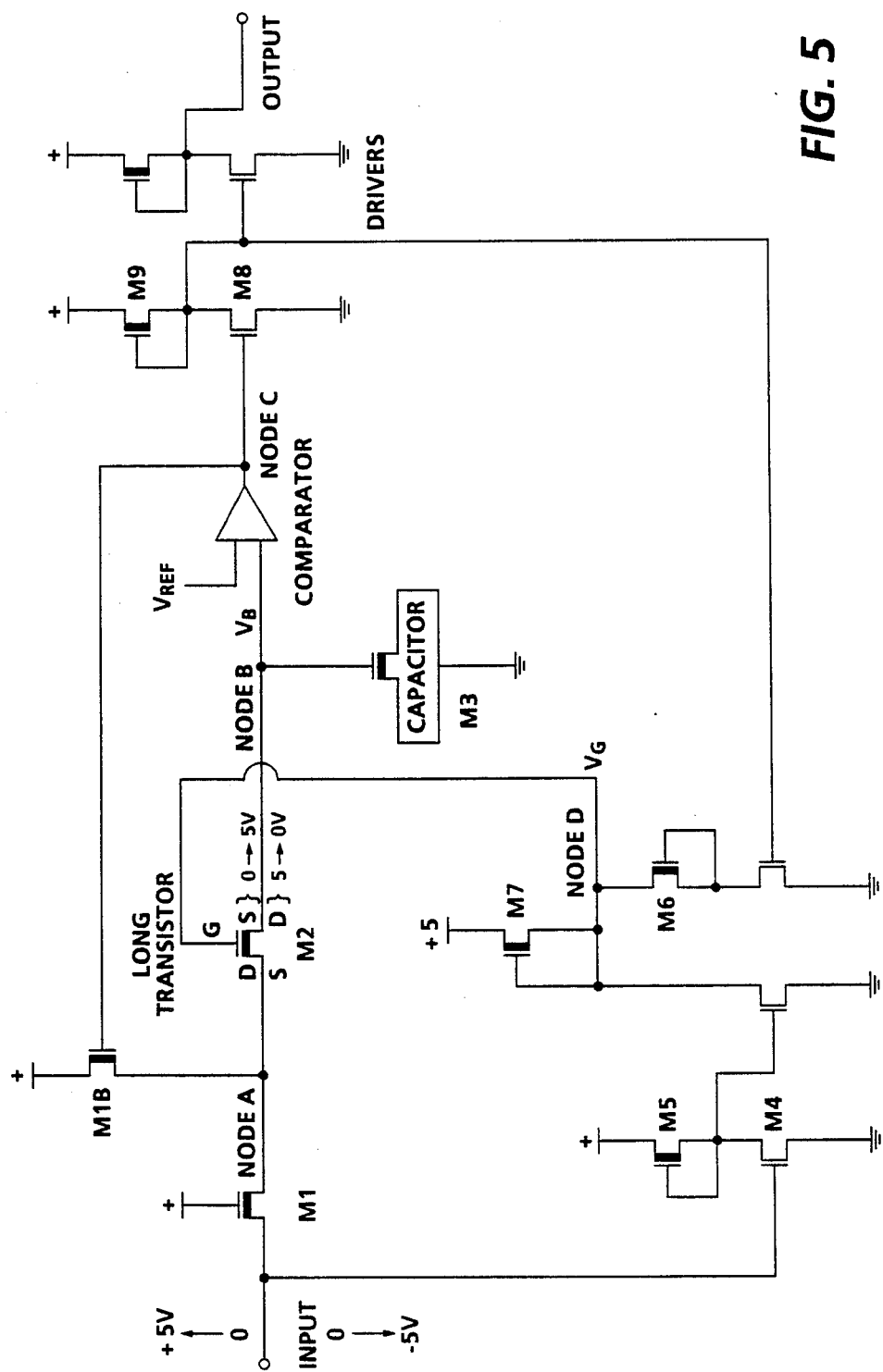
FIG. 5 is a schematic diagram of the circuit showing the present invention of a single transistor and capacitor with a very large time constant.

FIG. 5 of the present application illustrates the present invention for realizing a very large resistance with a reasonable size for the transistor. Only one long transistor M2 is used for realizing the large resistance, as compared to two identical long transistors for the circuit in FIG. 1. As seen in FIG. 5, the gate of transistor M2 is tied to a fixed voltage Vg at node D, rather than being tied to the source electrode. Vg is generated by a biasing circuit comprising transistors M6 and M7 and is initially arranged to be close to 0v. When the input voltage changes from low to high (0 to 5 v, for example), the voltage at node B starts increasing. As the voltage of node B increases, voltage Vgs (voltage from source to gate) of transistor M2 becomes more and more negative and drives transistor M2 deeper and deeper into the saturation region. Thus, transistor M2 is always operating in the saturation region providing a very large resistance. It should be noted that as soon as the voltage of node B reaches the reference voltage Vref of the comparator (for example, Vref=Vcc/2), the output of the comparator becomes high. At this point, the high resistance of transistor M2 is not necessary any longer. In fact, the large resistance of transistor M2 causes the pulse shrinkage which is a problem with conventional techniques as described above. As set forth above in conjunction with FIG. 1, the transistors M2A and M2B keep their large resistances throughout the operation of the RC filter.

When equation (1) is applied to the circuit in FIG. 5, Vgs is no longer zero, as in FIG. 1, but now would actually be a negative voltage. The threshold voltage would be the same, at Vthd=3.2 v. Thus Vgs=−2, the sum in the equation of Vgs and Vthd equals 1.2 rather than the 3.2 as it did for the equation as applied to FIG. 1. Therefore, by plugging the values into equation (1), the result is a larger resistance R with the same width to length (W/L) proportions. In other words, for the same resistance R values as in the prior art case discussed above in conjunction with FIG. 1, the W/L ratio could be larger. That is, the length L of transistor M2 could be about 200 microns as opposed to the necessary 4000 microns for FIG. 1.

Figure 6D:
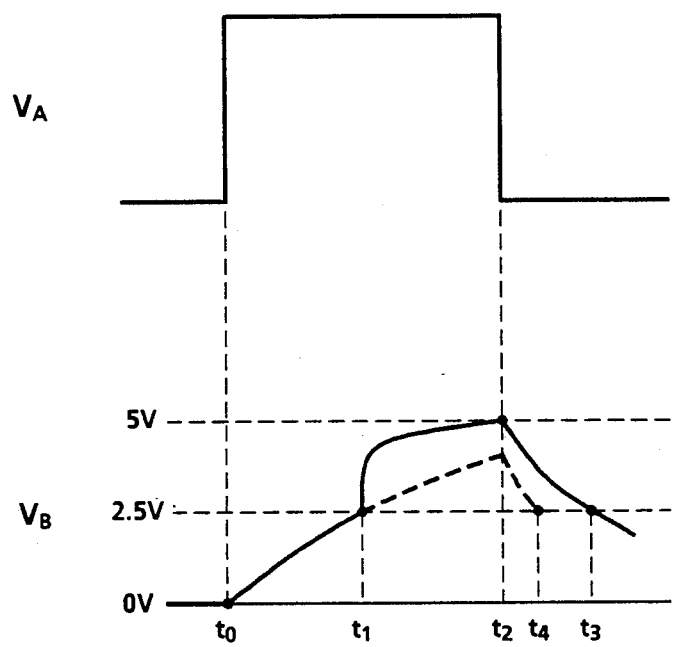
Figure 6D:
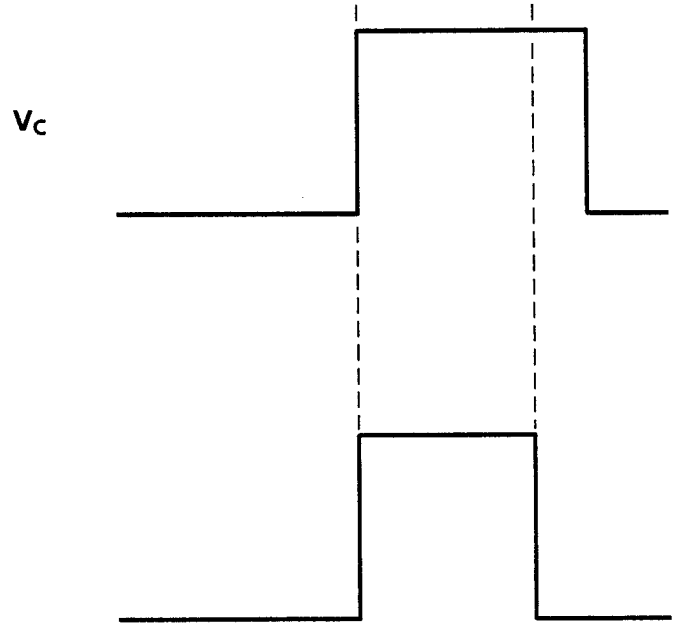

In order to minimize the pulse shrinkage, it is necessary to make the resistance of M2 as small as possible as soon as the output of the comparator becomes high. See FIG. 6A for an applied input data pulse and FIG. 6B for the RC constant curve. At t0, the pulse arrives and the capacitor begins charging at the RC time constant rate. When the charging voltage reaches the reference voltage Vref of the comparator, the output of the comparator goes high. At t1 the resistance of resistor R (transistor M2) is no longer needed at a high value. This is accomplished by a feedback from node C at the output of the comparator to the biasing circuit, transistor M1B so that the Vgs from node D becomes a large voltage (for example 5 v) immediately after node C becomes high. This immediately turns transistor M2 heavily on, providing a very small resistance thereby allowing the capacitor (transistor M3) to charge up very quickly. The rate of charge changes accordingly, as seen by the curve in FIG. 6B after time t1. When the input pulse turns off at time t2, the capacitor begins to discharge and when the falling voltage reaches the reference voltage Vref of the comparator, the comparator output goes low. The output pulse, therefore is approximately equal to the input pulse and minimizes the effect of pulse shrinkage. To compare what would have occurred with the circuit in FIG. 1, the dotted line curve in FIG. 6B shows what the charging and discharging would look like without the special circuitry of the present invention. That is, the comparator output would go high at time t1 and go low again at time t4. The 'shrunken' pulse is seen in FIG. 6D. However, by the present invention, the turning off of the output of the comparator is delayed by the rapid charging of the capacitor to a higher value, which then must discharge to the reference voltage Vref to turn off the comparator at time t3.

The operation of transistors M4 and M5 result in the waveshape of FIG. 6B. Between $t_0$ and $t_1$ a large time constant is required which is accomplished by making the voltage of node D close to zero. Between $t_1$ and $t_2$, however, the time constant should be very small which is accomplished by making the voltage of node D very high (about 5 v) thru the feedback network comprising transistors $M_8$, $M_9$, $M_6$ and $M_7$. Between $t_2$ and $t_3$ the time constant should be large again to provide the delay for the falling edge of the input signal. Therefore the voltage of node D should be low again. This is accomplished by transistros M4 and M5. Between $t_2$, $t_3$, when the output of COMPARATOR (node C) is high, transistor M1B is ON and, in conjunction with M1, makes a voltage divider to provide about 2.5 v for node A which is now the source electrode for transistor M2. With the voltage of node D low and the voltage of node A positive (about 2.5 v), the Vgs for M2 is negative again and makes the resistance of transistor M2 very large which in turn provides a large time constant for the falling edge of the input signals.

The output signal of the present invention is a more accurate representation of the input data signal applied, less silicon area is needed to accomplish the effect, and the input noise signals are filtered out.

While the invention has been described with reference to a specific embodiment, it will be understood by those skilled in the art that various changes may be made and the equivalents may be substituted for elements thereof without departing from the true spirit and scope of the invention. In addition, many modifications may be made without departing from the essential teachings of the invention.

What is claimed is:

1. A digital noise filter circuit having a digital input and a filtered digital output and further comprising:
   a capacitor,
   a comparator for comparing the charge across said capacitor against a predetermined reference, and for generating a high output voltage when the charge is above said predetermined reference, and a low output voltage when the charge is below said predetermined reference,
   transistor means responsive to the input voltage and coupled to said capacitor for charging said capacitor when there is a high voltage at said input and for discharging said capacitor when there is a low voltage at said input, and
   logic means responsive to the input voltage and to the comparator output voltage for allowing said transistor means to have low resistance when there is a high voltage at the input and at the output, to have a high resistance when the input is a high voltage and the output is a low voltage, and to have a high resistance when the input is a low voltage and the output is a high voltage.

* * * * *